(12) United States Patent
Seo et al.

(10) Patent No.: US 11,380,750 B2
(45) Date of Patent: Jul. 5, 2022

(54) DISPLAY APPARATUS WITH A SHIELDING LAYER BETWEEN ADJACENT DATA LINES

(71) Applicant: SAMSUNG DISPLAY CO., LTD., Yongin-si (KR)

(72) Inventors: Woori Seo, Yongin-si (KR); Injun Bae, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 100 days.

(21) Appl. No.: 16/518,010

(22) Filed: Jul. 22, 2019

(65) Prior Publication Data

US 2020/0135830 A1  Apr. 30, 2020

(30) Foreign Application Priority Data

Oct. 31, 2018  (KR) .......................... 10-2018-0132556

(51) Int. Cl.
  *H01L 27/32*  (2006.01)
  *G09G 3/3225*  (2016.01)
  *G09G 3/3275*  (2016.01)

(52) U.S. Cl.
  CPC ....... *H01L 27/3272* (2013.01); *G09G 3/3225* (2013.01); *G09G 3/3275* (2013.01); *H01L 27/3258* (2013.01); *H01L 27/3276* (2013.01); *G09G 2300/0426* (2013.01); *G09G 2330/06* (2013.01)

(58) Field of Classification Search
  CPC ............ H01L 27/3272; H01L 27/3276; H01L 27/3279; H01L 27/3258
  See application file for complete search history.

(56) References Cited

U.S. PATENT DOCUMENTS

| 7,221,425 B2 | 5/2007 | Jung et al. |
| 7,414,692 B2 | 8/2008 | Kim et al. |
| 2016/0163780 A1* | 6/2016 | Park .................... H01L 27/3248 257/40 |

FOREIGN PATENT DOCUMENTS

| KR | 1019890011061 A | 8/1989 |
| KR | 100390456 B1 | 6/2003 |
| KR | 1020060114995 A | 11/2006 |
| KR | 100743940 B1 | 7/2007 |
| KR | 100839379 B1 | 6/2008 |

* cited by examiner

*Primary Examiner* — Jesse Y Miyoshi
(74) *Attorney, Agent, or Firm* — Cantor Colburn LLP

(57) ABSTRACT

A display apparatus includes a substrate, a first pixel positioned on the substrate, a first data line which applies a first data signal to the first pixel, a second pixel positioned on the substrate and being adjacent to the first pixel, a second data line which applies a second data signal to the second pixel, and a shielding layer between the first data line and the second data line. The first data line and the second data line are parallel to each other and are disposed at different heights, and the shielding layer includes a metallic layer.

20 Claims, 11 Drawing Sheets

DISPLAY APPARATUS WITH A SHIELDING LAYER BETWEEN ADJACENT DATA LINES

CROSS-REFERENCE TO RELATED APPLICATION

This application claims priority to Korean Patent Application No. 10-2018-0132556, filed on Oct. 31, 2018, and all the benefits accruing therefrom under 35 U.S.C. § 119, the content of which in its entirety is herein incorporated by reference.

BACKGROUND

1. Field

One or more exemplary embodiments relate to a display apparatus.

2. Description of the Related Art

As the field of displays that represent a variety of electrical signal information visually has been rapidly developed, a variety of flat panel display apparatuses having excellent characteristics such as slimness, light weight, and low consumption electrification, have been introduced, and resolution thereof is also increasing.

An increase in the resolution of a display apparatus means an increase in the number of pixels in the display apparatus per unit area. Thus, as the resolution of the display apparatus is increasing, the number of wirings for applying electrical signals to the pixels in the display apparatus is also increasing. As a result, a distance between the wirings is reduced and thus signal interference between the wirings occurs and the quality of an image of the display apparatus may be lowered.

SUMMARY

One or more exemplary embodiments include a display apparatus that may prevent signal interference between wirings from occurring.

Additional aspects will be set forth in part in the description which follows and, in part, will be apparent from the description, or may be learned by practice of the presented exemplary embodiments.

According to one or more exemplary embodiments, a display apparatus includes a substrate, a first pixel positioned on the substrate, a first data line which applies a first data signal to the first pixel; a second pixel positioned on the substrate and being adjacent to the first pixel, a second data line which applies a second data signal to the second pixel, and a shielding layer between the first data line and the second data line. The first data line and the second data line are parallel to each other and are positioned at different heights, and the shielding layer includes a metallic layer.

The shielding layer may further include a metallic oxide layer on the metallic layer.

A metallic oxide in the metallic oxide layer may be an oxide of metal in the metallic layer.

A concentration of oxygen included in the metallic oxide layer may be gradually increased from a lower portion to an upper portion of the metallic oxide layer.

The display apparatus may further include, between the first data line and the second date line, a first insulating layer and a second insulating layer, which are positioned at a lower portion and an upper portion of the shielding layer, respectively.

Each of the first pixel and the second pixel may include an organic light-emitting diode ("OLED") and a pixel electrode and a circuit unit for driving the OLED, and the circuit unit may include a thin-film transistor ("TFT") including a drain electrode electrically connected to the pixel electrode, the first data line may be on the same layer as the drain electrode, and an organic insulating layer may be positioned between the second data line and the pixel electrode.

The pixel electrode may be electrically connected to the drain electrode via a contact hole in the organic insulating layer, the second insulating layer, the shielding layer, and the first insulating layer, and the second insulating layer may cover side surfaces of the shielding layer and the first insulating layer at an inner side surface of the contact hole.

The shielding layer may be formed as one body commonly so as to correspond to the first pixel and the second pixel.

The shielding layer may be in a floating state.

A width of the second data line positioned on the shielding layer may be greater than a width of the first data line positioned under the shielding layer.

According to one or more exemplary embodiments, a display apparatus includes a pixel unit including a plurality of pixels and a plurality of data lines which applies a data signal to the plurality of pixels and is arranged to be parallel to each other, a data driving unit which generates the data signal and is connected to the plurality of data lines, and a shielding layer which blocks signal interference between two adjacent data lines among the plurality of data lines, is positioned between the two adjacent data lines, and is positioned as one body commonly to correspond to the plurality of pixels. The two adjacent data lines are at different heights.

The shielding layer may include a metallic layer and a metallic oxide layer on the metallic layer.

A metallic oxide in the metallic oxide layer may be an oxide of metal in the metallic layer.

A concentration of oxygen in the metallic oxide layer may be gradually increased from a lower portion to an upper portion of the metallic oxide layer.

The shielding layer may be in a floating state.

First data lines among the plurality of data lines positioned at the lower portion of the shielding layer, and second data lines among the plurality of data lines positioned at the upper portion of the shielding layer, may be alternately arranged in a first direction.

The display apparatus may further include, between the first data lines and the second data lines, a first insulating layer and a second insulating layer, which are positioned at the lower portion and the upper portion of the shielding layer, respectively.

Each of the plurality of pixels may include an organic light-emitting diode (OLED) and a pixel electrode and a circuit unit for driving the OLED, and the circuit unit may include a thin-film transistor (TFT) including a drain electrode electrically connected to the pixel electrode, and the first data lines may be positioned on a same layer as the drain electrode, and an organic insulating layer may be positioned on the second data lines, and the pixel electrode may be positioned on the organic insulating layer.

The pixel electrode may be electrically connected to the drain electrode via a contact hole in the organic insulating layer, the second insulating layer, the shielding layer, and the first insulating layer, and the second insulating layer may cover side surfaces of the shielding layer and the first insulating layer at an inner side surface of the contact hole.

Widths of the second data lines may be greater than widths of the first data lines.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
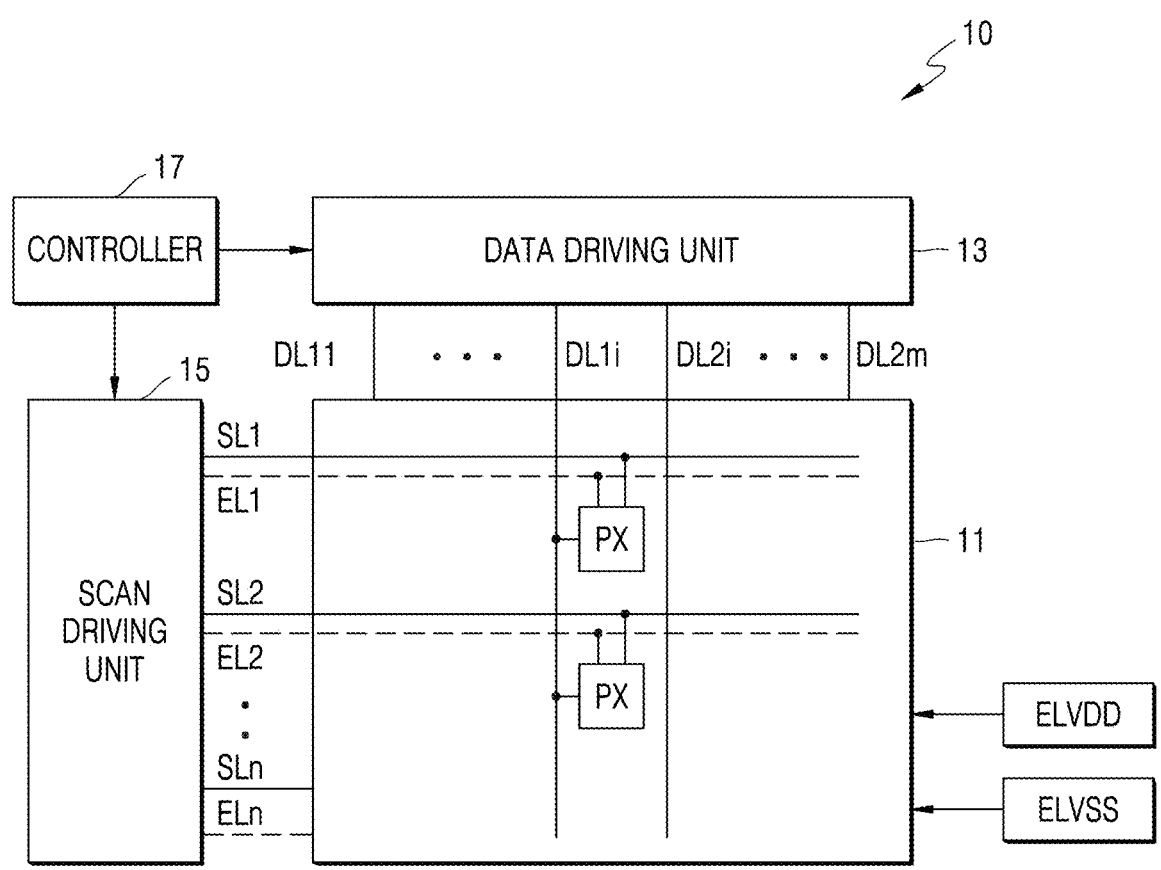
FIG. 1 is a plan view schematically illustrating a display apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items.

As the present disclosure allows for various changes and numerous exemplary embodiments, particular exemplary embodiments will be illustrated in the drawings and described in detail in the written description. The effects and features of the present disclosure, and ways to achieve them will become apparent by referring to exemplary embodiments that will be described later in detail with reference to the drawings. However, the invention is not limited to the following exemplary embodiments but may be embodied in various forms.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "includes" and/or "including" used herein specify the presence of stated features or components, but do not preclude the presence or addition of one or more other features or components.

It will be understood that when a layer, region, or component is referred to as being "on/under" another layer, region, or component, it may be directly or indirectly disposed on/under the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the invention is not limited thereto.

When a certain exemplary embodiment may be implemented differently, a specific process order may be performed differently from the described order. For example, two consecutively described processes may be performed substantially at the same time or performed in an order opposite to the described order.

Hereinafter, exemplary embodiments of the present disclosure will be described below in more detail with reference to the accompanying drawings. The same reference numerals are used for components that are the same or are in correspondence, and a detailed description thereof will be omitted.

FIG. 1 is a plan view schematically illustrating a display apparatus according to an exemplary embodiment.

Referring to FIG. 1, a display apparatus 10 according to an exemplary embodiment may include a pixel unit 11, a data driving unit 13, a scan driving unit 15, and a controller 17.

The pixel unit 11 may include a plurality of scan lines SL1 to SLn, a plurality of data lines DL11 to DL2m, a plurality of emission control lines EL1 to ELn, and a plurality of pixels PX. Each of the plurality of pixels PX may include a light-emitting device and a circuit unit for driving the light-emitting device. In an exemplary embodiment, the light-emitting device may be an organic light-emitting device, and the circuit unit may include a plurality of transistors and a capacitor.

The plurality of scan lines SL1 to SLn may be arranged in rows. For example, the scan lines SL1 to SLn may be connected to the scan driving unit 15 and may transmit scan signals generated by the scan driving unit 15 to the pixels PX.

The scan driving unit 15 generates scan signals in response to a control signal of the controller 17 and supplies the scan signals to the scan lines SL1 to SLn. Also, the scan driving unit 15 may be connected to the plurality of emission control lines EL1 to ELn, may generate emission control signals in response to the control signal of the controller 17, and may supply the emission control signals to the emission control lines EL1 to ELn. Each of the plurality of emission control lines EL1 to ELn transmits the emission control signals to the pixel unit 11. In another exemplary embodiment, the emission control signals may be generated by a separate emission control driving unit and may also be applied to the pixel unit 11. A driving voltage ELVDD and a common voltage ELVSS are applied to each of the pixels PX of the pixel unit 11. The common voltage ELVSS may be a lower voltage than the driving voltage ELVDD.

The plurality of data lines DL11 to DL2m are arranged in columns, for example, and transmit data signals to the pixels PX. Each pixel PX may be in a portion in which the plurality of scan lines SL1 to SLn and the plurality of data lines DL11 to DL2m intersect with each other.

The data driving unit 13 is connected to the plurality of data lines DL11 to DL2m. The data driving unit 13 converts video signals into data signals having the format of a voltage or current in response to the control signal of the controller 17. The data driving unit 13 applies the data signals to the plurality of data lines DL11 to DL2m.

The controller 17 generates a plurality of control signals in response to synchronous signals supplied from the outside. The controller 17 outputs the control signals for controlling the data driving unit 13 to the data driving unit 13 and outputs the control signals for controlling the scan driving unit 15 to the scan driving unit 15.

As the resolution of the display apparatus 10 increases, the number of pixels PX increases and therefore the size of each pixel PX in the pixel unit 11 decreases. Thus, the numbers of scan lines SL1 to SLn, data lines DL11 to DL2m, and emission control lines EL1 to ELn for applying electrical signals to the pixels increase. As a result, a distance therebetween decreases. In particular, as a distance between the plurality of data lines DL11 to DL2m (e.g., a distance between two adjacent data lines) decreases, electrical interference between the plurality of data lines DL11 to DL2m (e.g., the electrical interference between two adjacent data lines) occurs, and due to crosstalk, unintended data signals may be applied to the pixels PX (e.g., the pixels PX receiving the distorted data signals). However, as will be described later, according to exemplary embodiments, two adjacent data lines among the data lines DL11 to DL2m may be at different heights, and a shielding layer for cutting off transmission of electrical signals are therebetween so that the interference may be effectively prevented from occurring between two adjacent data lines. This will be described later with reference to FIGS. 3 through 11.

Figure 2:
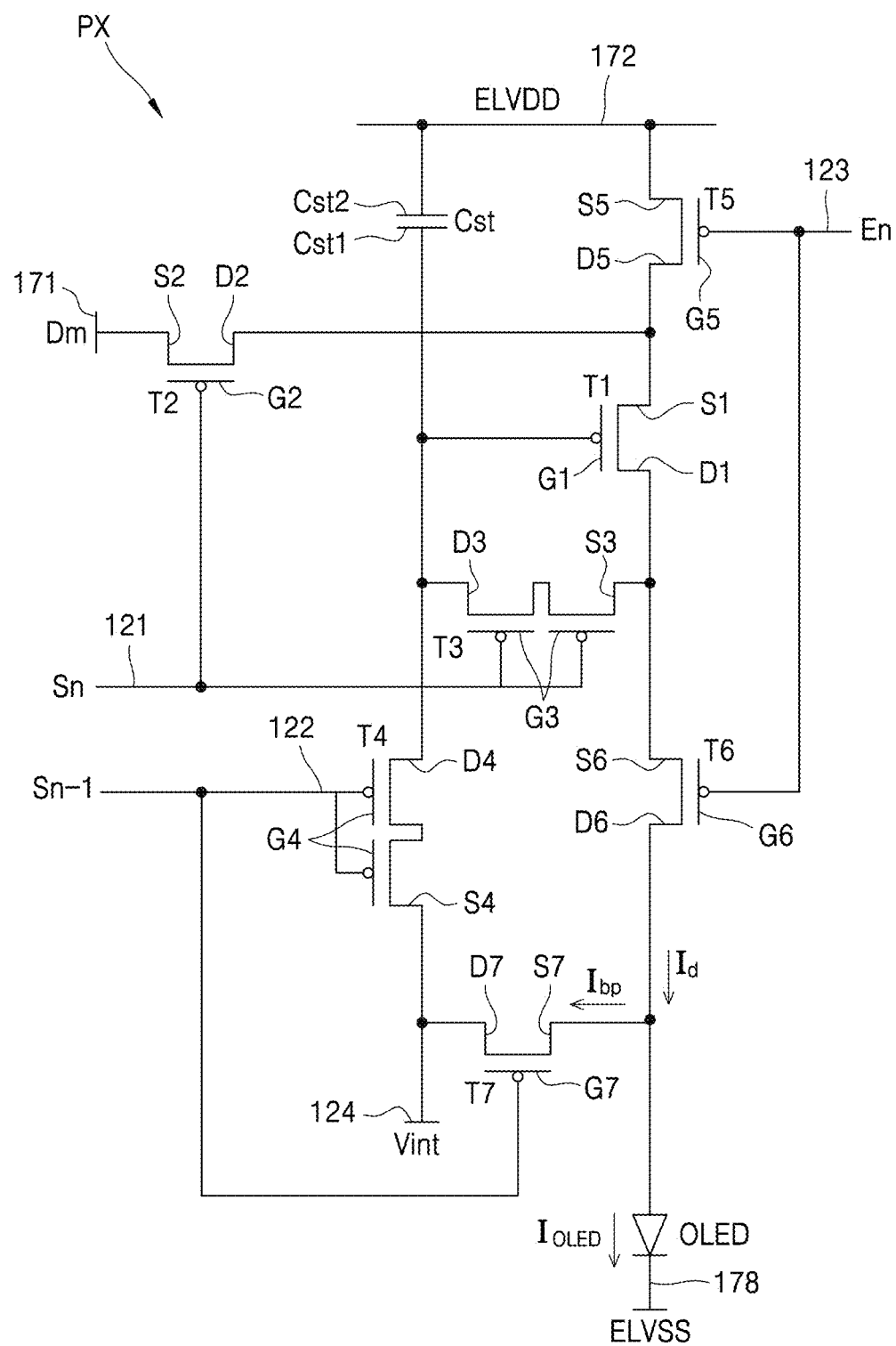
FIG. 2 is an exemplary equivalent circuit diagram of pixels of the display apparatus of FIG. 1.

FIG. 2 is an exemplary equivalent circuit diagram of pixels of the display apparatus 10 of FIG. 1.

As illustrated in FIG. 2, one pixel PX may include a plurality of TFTs, for example, a driving TFT T1, a switching TFT T2, a compensation TFT T3, an initialization TFT T4, an operation control TFT T5, an emission control TFT T6, and a bypass TFT T7, a capacitor Cst, and an organic light-emitting diode ("OLED"). It will be understood that the driving TFT T1, the switching TFT T2, the compensation TFT T3, the initialization TFT T4, the operation control TFT T5, the emission control TFT T6, and the bypass TFT T7 or the capacitor Cst may be components in the pixel circuit of the pixel PX. The circuit unit is electrically connected to a plurality of signal lines, for example, a scan line 121, a previous scan line 122, an emission control line 123, an initialization voltage line 124, a data line 171, and power supply lines 172 and 178.

The scan line 121 may transmit a scan signal Sn, the previous scan line 122 may transmit a previous scan signal Sn-1 to the initialization TFT T4 and the bypass TFT T7. The emission control line 123 may transmit an emission control signal En to the operation control TFT T5 and the emission control TFT T6. The data line 171, which intersects with the scan line 121, may transmit a data signal Dm. The initialization voltage line 124 may transmit an initialization voltage Vint to the driving TFT T1 so as to initialize the driving TFT T1.

The driving TFT T1 receives the data signal Dm according to a switching operation of the switching TFT T2 and supplies a driving current $I_{OLED}$ to the OLED. A gate electrode G1 of the driving TFT T1 is connected to a lower electrode Cst1 of the capacitor Cst, and a source electrode S1 of the driving TFT T1 is connected to the power supply line 172 via the operation control TFT T5, and a drain electrode D1 of the driving TFT T1 is electrically connected to a pixel electrode of the OLED via the emission control TFT T6.

A gate electrode G2 of the switching TFT T2 is connected to the scan line 121, and a source electrode S2 of the switching TFT T2 is connected to the data line 171. A drain electrode D2 of the switching TFT T2 is connected to the source electrode S1 of the driving TFT T1 and is connected to the power supply line 172 via the operation control TFT T5. The switching TFT T2 is turned on according to the scan signal Sn transmitted through the scan line 121 and performs a switching operation of transmitting the data signal Dm transmitted via the data line 171 to the source electrode S1 of the driving TFT T1.

A gate electrode G3 of the compensation TFT T3 is connected to the scan line 121, and a source electrode S3 of the compensation TFT T3 is connected to the drain electrode D1 of the driving TFT T1 and is connected to a pixel electrode of the OLED via the emission control TFT T6. A drain electrode D3 of the compensation TFT T3 is connected to the lower electrode Cst1 of the capacitor Cst, a drain electrode D4 of the initialization TFT T4, and the gate electrode G1 of the driving TFT T1. The compensation TFT T3 is turned on according to the scan signal Sn transmitted through the scan line 121 and electrically connects the gate electrode G1 and the drain electrode D1 of the driving TFT T1 to each other so as to diode-connect the driving TFT T1.

A gate electrode G4 of the initialization TFT T4 is connected to the previous scan line 122, and a source electrode S4 of the initialization TFT T4 is connected to a drain electrode D7 of the bypass TFT T7 and the initialization voltage line 124. The drain electrode D4 of the initialization TFT T4 is connected to the lower electrode Cst1 of the capacitor Cst, the drain electrode D3 of the compensation TFT T3, and the gate electrode G1 of the driving TFT T1. The initialization TFT T4 is turned on according to the previous scan signal Sn-1 transmitted through the previous scan line 122, transmits the initialization voltage Vint to the gate electrode G1 of the driving TFT T1 so as to perform an initialization operation for initializing a voltage of the gate electrode G1 of the driving TFT T1.

A gate electrode G5 of the operation control TFT T5 is connected to the emission control line 123, and a source electrode S5 of the operation control TFT T5 is connected to the power supply line 172, and a drain electrode D5 of the operation control TFT T5 is connected to the source electrode S1 of the driving TFT T1 and the drain electrode D2 of the switching TFT T2.

A gate electrode G6 of the emission control TFT T6 is connected to the emission control line 123, and a source electrode S6 of the emission control TFT T6 is connected to the drain electrode D1 of the driving TFT T1 and the source electrode S3 of the compensation TFT T3. A drain electrode D6 of the emission control TFT T6 is electrically connected to a source electrode S7 of the bypass TFT T7 and a pixel electrode of the OLED. The operation control TFT T5 and the emission control TFT T6 are simultaneously turned on according to the emission control signal En transmitted through the emission control line 123. The driving voltage ELVDD is transmitted to the OLED so that the driving current $I_{OLED}$ may flow through the OLED when the operation control TFT T5 and the emission control TFT T6 are simultaneously turned on.

A gate electrode G7 of the bypass TFT T7 is connected to the previous scan line 122, and a source electrode S7 of the bypass TFT T7 is connected to the drain electrode D6 of the emission control TFT T6 and the pixel electrode of the OLED, and a drain electrode D7 of the bypass TFT T7 is connected to the source electrode S4 of the initialization TFT T4 and the initialization voltage line 124. The gate electrode G7 of the bypass TFT T7 receives the previous scan signal Sn-1 via the previous scan line 122. When an electrical signal of a voltage at a predetermined level, at which the bypass TFT T7 may be turned off, is applied from the previous scan signal Sn-1, the bypass TFT T7 is turned off so that a part of a driving current $I_d$ (i.e., a bypass current $I_{bp}$) may escape through the bypass TFT T7.

If the OLED emits light even when a minimum current of the driving TFT T1 for displaying a black image flows as a driving current, the black image is not properly displayed. Here, the minimum current of the driving TFT T1 refers to a current under conditions that a gate-source voltage $V_{GS}$ of the driving TFT T1 is less than a threshold voltage Vth and the driving TFT T1 is turned off. Thus, in order to prevent the OLED from emitting light when the minimum current flows as the driving current, the bypass TFT T7 may diverge a part of the current $I_d$ that flows from the driving TFT T1 (i.e., the bypass current $I_{bp}$) to a different current path other than a current path toward the OLED. By this feature, a smaller current than the minimum driving current (for example, a current that is equal to or less than 10 Picoampere (pA)) under conditions that the driving TFT T1 is turned off, is transmitted to the OLED and thus the OLED does not emit light or the degree of emission is minimized and accordingly, the black image may be realized.

In FIG. 2, the initialization TFT T4 and the bypass TFT T7 are connected to the previous scan line 122. However, the invention is not limited thereto. In exemplary another embodiment, the initialization TFT T4 is connected to the previous scan line 122 and is driven according to the previous scan signal Sn-1, and the bypass TFT T7 may be connected to a separate wiring and may be driven according to a signal transmitted to the wiring.

An upper electrode Cst2 of the capacitor Cst is connected to the power supply line 172, and an opposite electrode of the OLED is connected to the common voltage ELVSS. Thus, the OLED may emit light by receiving the driving current $I_{OLED}$ from the driving TFT T1.

In FIG. 2, the compensation TFT T3 and the initialization TFT T4 have a dual gate electrode. However, the invention is not limited thereto. In another exemplary embodiment, for example, the compensation TFT T3 and the initialization TFT T4 may have one gate electrode. Also, various modifications are possible. In another exemplary embodiment, at least one of the TFTS T1, T2, T5, T6, and T7 other than the compensation TFT T3 and the initialization TFT T4 may have a dual gate electrode.

Hereinafter, a detailed structure of the display apparatus 10 of FIG. 1 will be described with reference to FIGS. 3 through 9.

Figure 3:
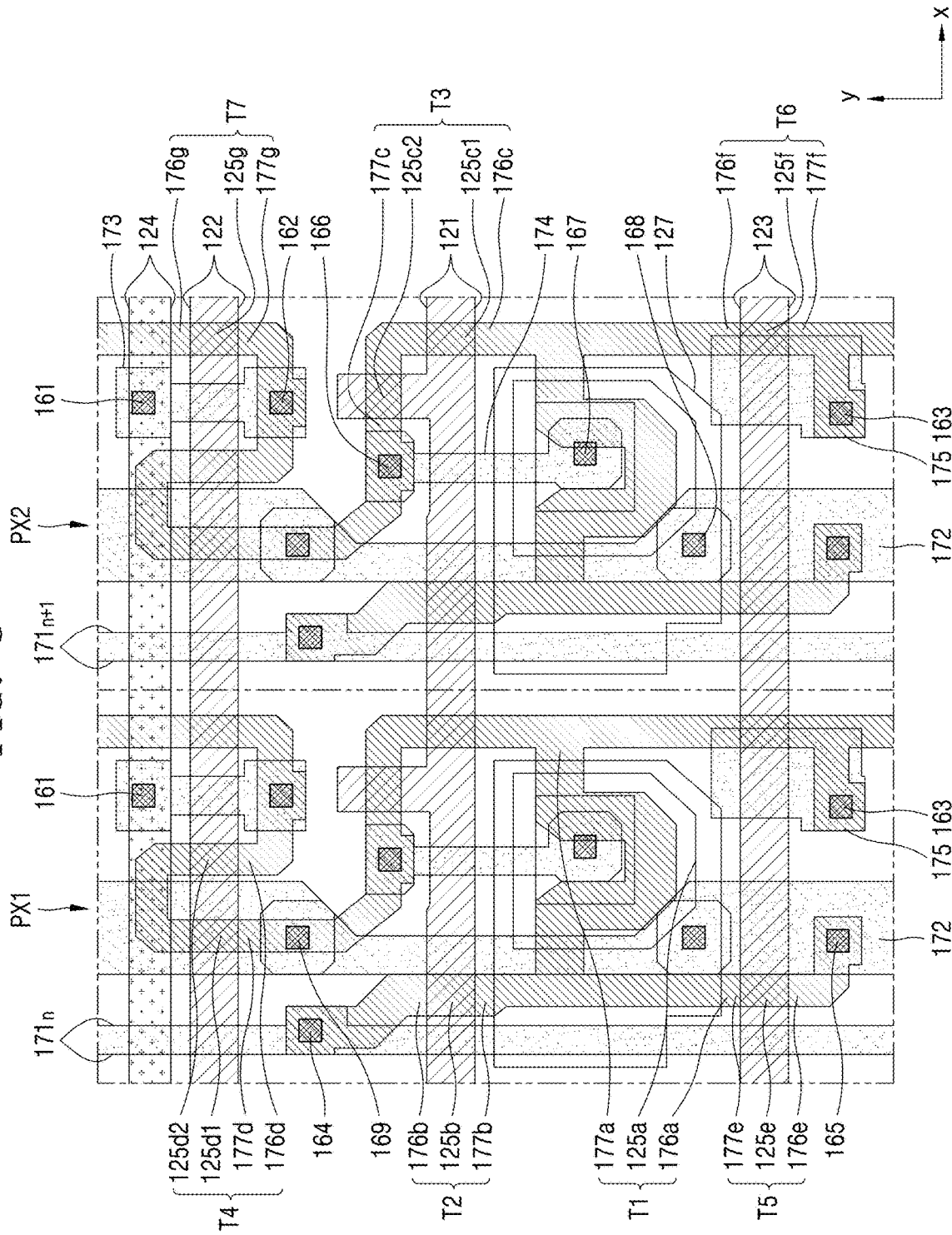
FIG. 3 is an arrangement view schematically illustrating exemplary positions of thin-film transistors ("TFTs") and a capacitor arranged in the pixels of the display apparatus of FIG. 1.

FIG. 3 illustrates exemplary positions of TFTs and a capacitor of two adjacent pixels PX1 and PX2, and FIGS. 4 through 8 illustrate components, such as TFTs and a capacitor, in the two pixels PX1 and PX2 according to layers. Hereinafter, in the case where portions of the first pixel PX1 and the second pixel PX2 have the same shape, the portion will not be separately described.

Figure 9:
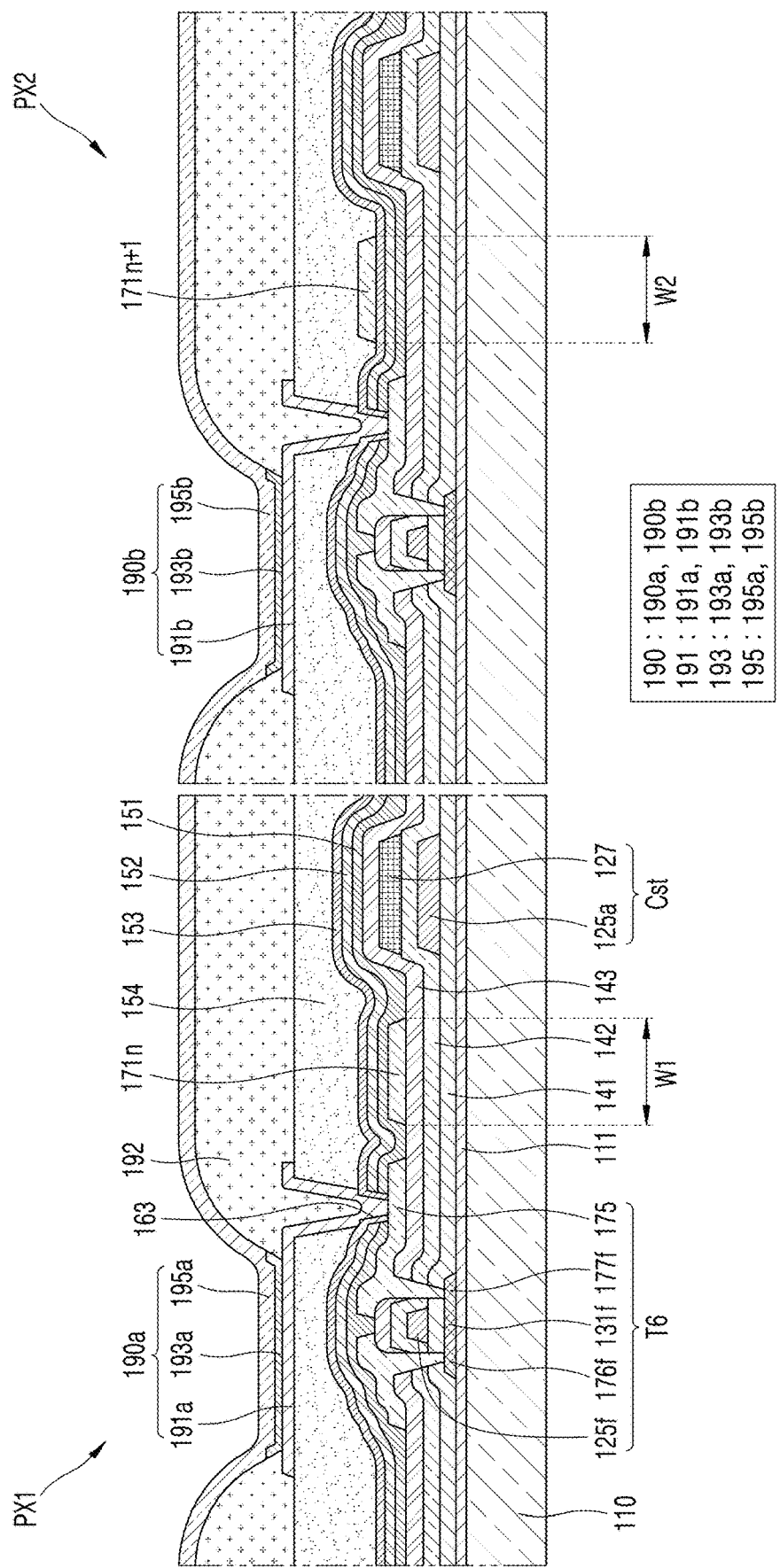
FIG. 9 is a cross-sectional view schematically illustrating a part of the display apparatus of FIG. 1.

Also, FIG. 9 is a cross-sectional view schematically illustrating a part of the display apparatus 10 of FIG. 1, where cross-sections of several portions of the two pixels PX1 and PX2 are illustrated as connected to each other for convenience. That is, the portions shown in FIG. 9 do not need to be adjacent to each other. For example, a portion in which the emission control TFT T6 and an OLED 190a of the first pixel PX1 are illustrated, a portion in which the capacitor Cst is illustrated, and a portion in which a first data line 171n is illustrated, may not be adjacent to each other, different from FIG. 9. Of course, relative positions thereof do not need to be in the order shown in FIG. 9. That is, in another exemplary embodiment, the first data line 171n may be disposed in a portion other than between the portion in which the emission control TFT T6 and the OLED 190a in the first pixel PX1 are illustrated, and the portion in which the capacitor Cst is illustrated.

As illustrated in FIG. 9, the display apparatus 10 includes a substrate 110. The substrate 110 may include various materials, such as a glass material, a metal material, or a plastic material. A plurality of pixels including the first pixel PX1 and the second pixel PX2 may be disposed on the substrate 110. A buffer layer 111 may be positioned on the substrate 110. The buffer layer 111 may planarize a surface of the substrate 110 or may prevent penetration of impurities into a semiconductor layer thereon. In an exemplary embodiment, the buffer layer 111 may have a single layer/multi-layer structure including an inorganic insulating material, such as silicon oxide, silicon nitride or silicon oxynitride.

Figure 4:
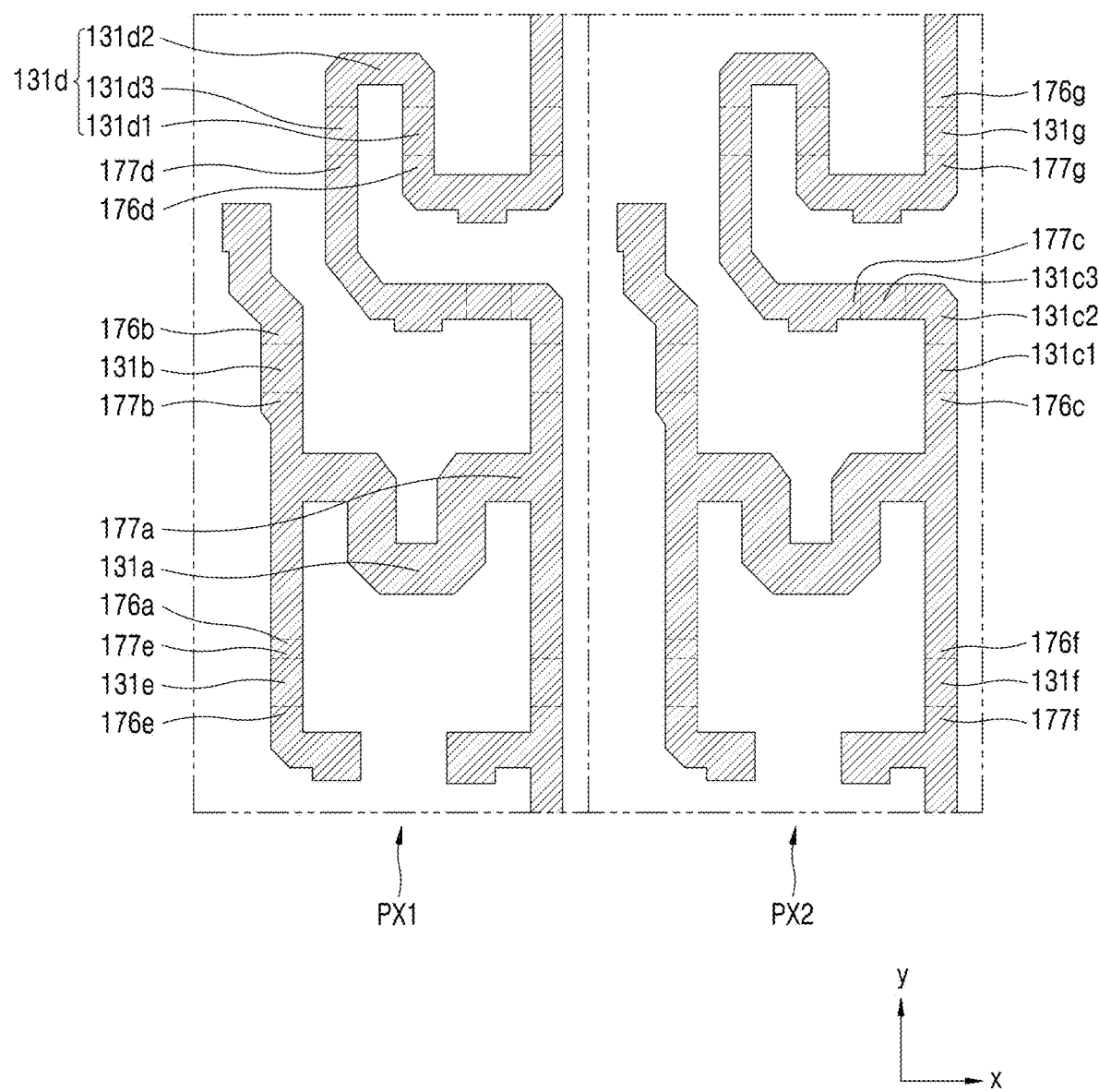
FIGS. 4 through 8 are arrangement views schematically illustrating components, such as a plurality of TFTs and a capacitor of FIG. 3, according to layers.

The semiconductor layer may be positioned on the buffer layer 111. The semiconductor layer may have a variety of uneven shapes, as shown in FIG. 4, and the first pixel PX1 and the second pixel PX2 may include semiconductor layers having the same shape. Hereinafter, in the case where layers of the first pixel PX1 and the second pixel PX2 have the same shape, the layers will not be separately described.

The semiconductor layer may include a driving channel region 131a that corresponds to the driving TFT T1, a switching channel region 131b that corresponds to the switching TFT T2, compensation channel regions 131c1, 131c2, and 131c3 that correspond to the compensation TFT T3, initialization channel regions 131d1, 131d2, and 131d3 that correspond to the initialization TFT T4, an operation control channel region 131e that corresponds to the operation control TFT T5, an emission control channel region 131f that corresponds to the emission control TFT T6, and a bypass channel region 131g that corresponds to the bypass TFT T7 (See FIG. 4). That is, it will be understood that the driving channel region 131a, the switching channel region 131b, the compensation channel regions 131c1, 131c2, and 131c3, the initialization channel regions 131d1, 131d2, and 131d3, the operation control channel region 131e, the emission control channel region 131f, and the bypass channel region 131g may be partial regions of the semiconductor layer shown in FIG. 4.

The semiconductor layer may include polysilicon. The semiconductor layer may include, for example, the above-described channel regions in which no impurities are doped, and source regions and drain regions in which impurities at both sides of the channel regions are doped. Here, the impurity may vary according to the type of a TFT and may include an N-type impurity or P-type impurity. A channel region, a source region at one side of the channel region, and a drain region at the other side of the channel region may be referred to as an active layer. That is, it will be understood that the TFT has an active layer and the active layer includes a channel region, a source region, and a drain region.

The doped source region and drain region may be interpreted as a source electrode and drain electrode of the TFT, respectively, according to circumstances. That is, for example, a driving source electrode may correspond to a driving source region 176a in which an impurity is doped, near the driving channel region 131a in the semiconductor layer shown in FIG. 4, and a driving drain electrode may correspond to a driving drain region 177a in which an impurity is doped, near the driving channel region 131a in the semiconductor layer shown in FIG. 4.

In an exemplary embodiment, a first gate insulating layer 141 including an inorganic insulating material, such as silicon nitride, silicon oxide or silicon oxynitride, may be positioned at an upper portion of the semiconductor layer. (See FIG. 9).

Conductive layers such as a gate electrode 125f and a lower electrode 125a are positioned on the first gate insulating layer 141. Of course, a variety of conductive layers may be positioned on the first gate insulating layer 141. The variety of conductive layers positioned on the first gate insulating layer 141 including the gate electrode 125f and the lower electrode 125a may be referred to as a first gate wiring. The first gate wiring may include the scan line 121, the previous scan line 122, the emission control line 123, and the lower electrode 125a, as shown in FIG. 5.

Figure 5:
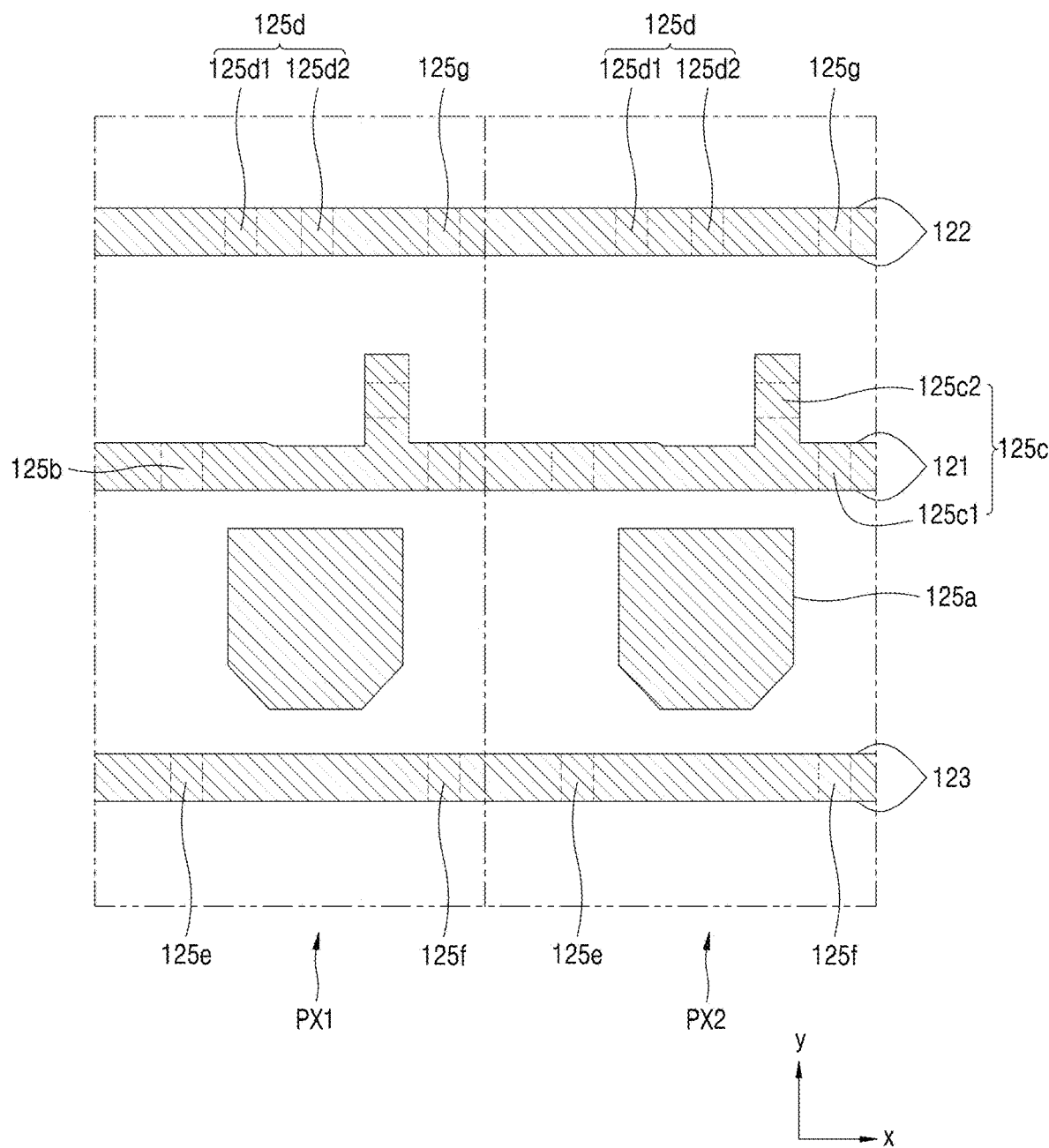

As shown in FIG. 5, it will be understood that a switching gate electrode 125b and compensation gate electrodes 125c1 and 125c2 may be portions of the scan line 121 or portions that protrude from the scan line 121, and initialization gate electrodes 125d1 and 125d2 and a bypass gate electrode 125g may be portions of the previous scan line 122 or portions that protrude from the previous scan line 122, and an operation control gate electrode 125e and the gate electrode 125f may be portions of the emission control line 123 or portions that protrude from the emission control line 123. The scan line 121, the previous scan line 122 and the emission control line 123 intersect with the semiconductor layer.

A second gate insulating layer 142 may cover the first gate wiring. In an exemplary embodiment, the second gate insulating layer 142 may include an inorganic insulating material, such as silicon nitride, silicon oxide, or silicon oxynitride.

Figure 6:
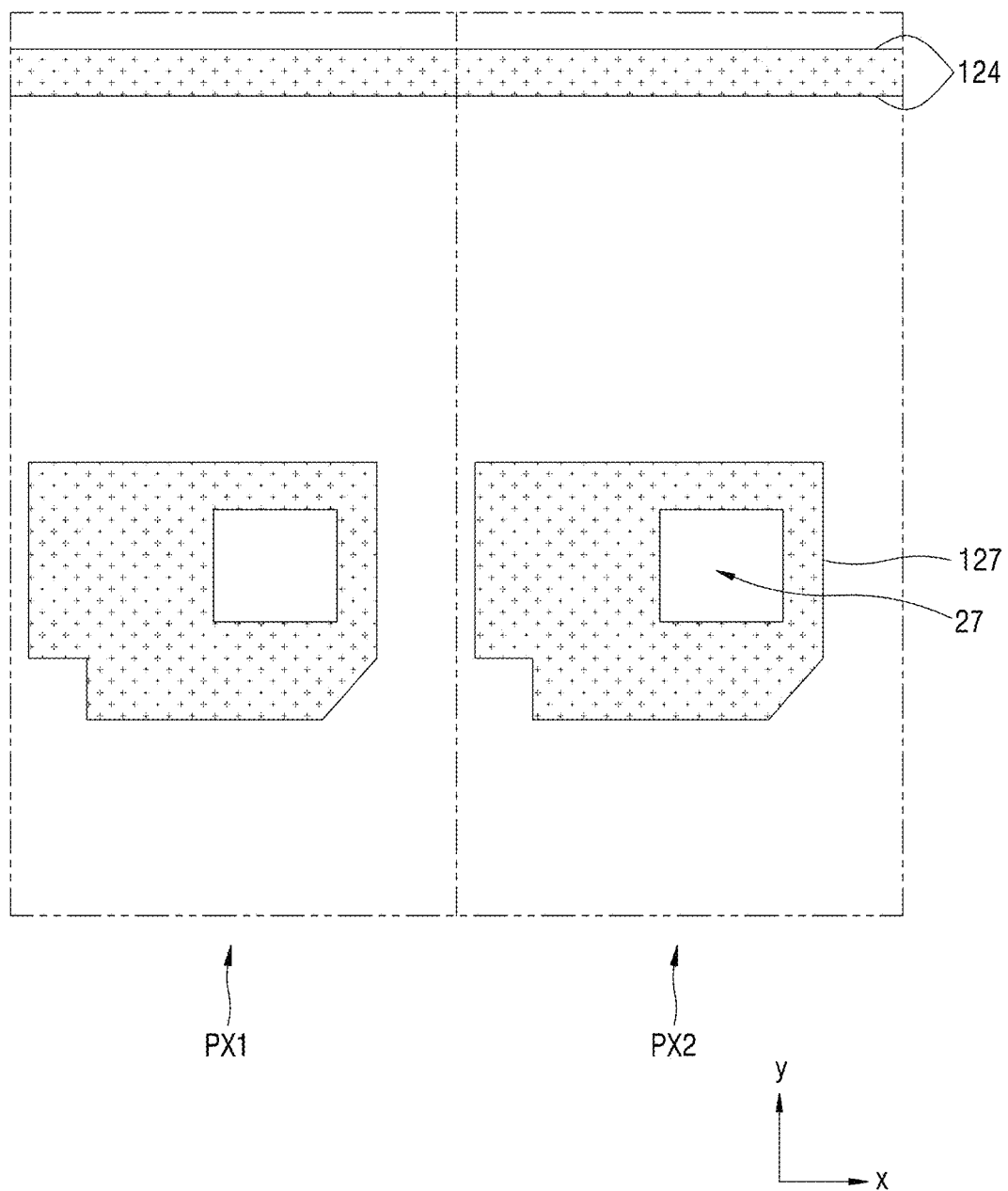

An upper electrode 127 of the capacitor Cst may be positioned on the second gate insulating layer 142. Of course, as shown in FIG. 6, the initialization voltage line 124 may be positioned on the second gate insulating layer 142, i.e., on the same layer as the upper electrode 127. A variety of conductive layers positioned on the second gate insulating layer 142 may be referred to as a second gate wiring.

As shown in FIG. 6, an opening 27 may be defined in the upper electrode 127. The lower electrode 125a and a compensation drain region 177c of the compensation TFT T3 may be electrically connected to each other through a connection member 174. The connection member 174 may pass through the opening 27 and that will be described later.

An interlayer insulating layer 143 is positioned on the second gate wiring (See FIG. 9). In an exemplary embodiment, the interlayer insulating layer 143 may include an inorganic insulating material, such as silicon nitride, silicon oxide, or silicon oxynitride.

Figure 7:
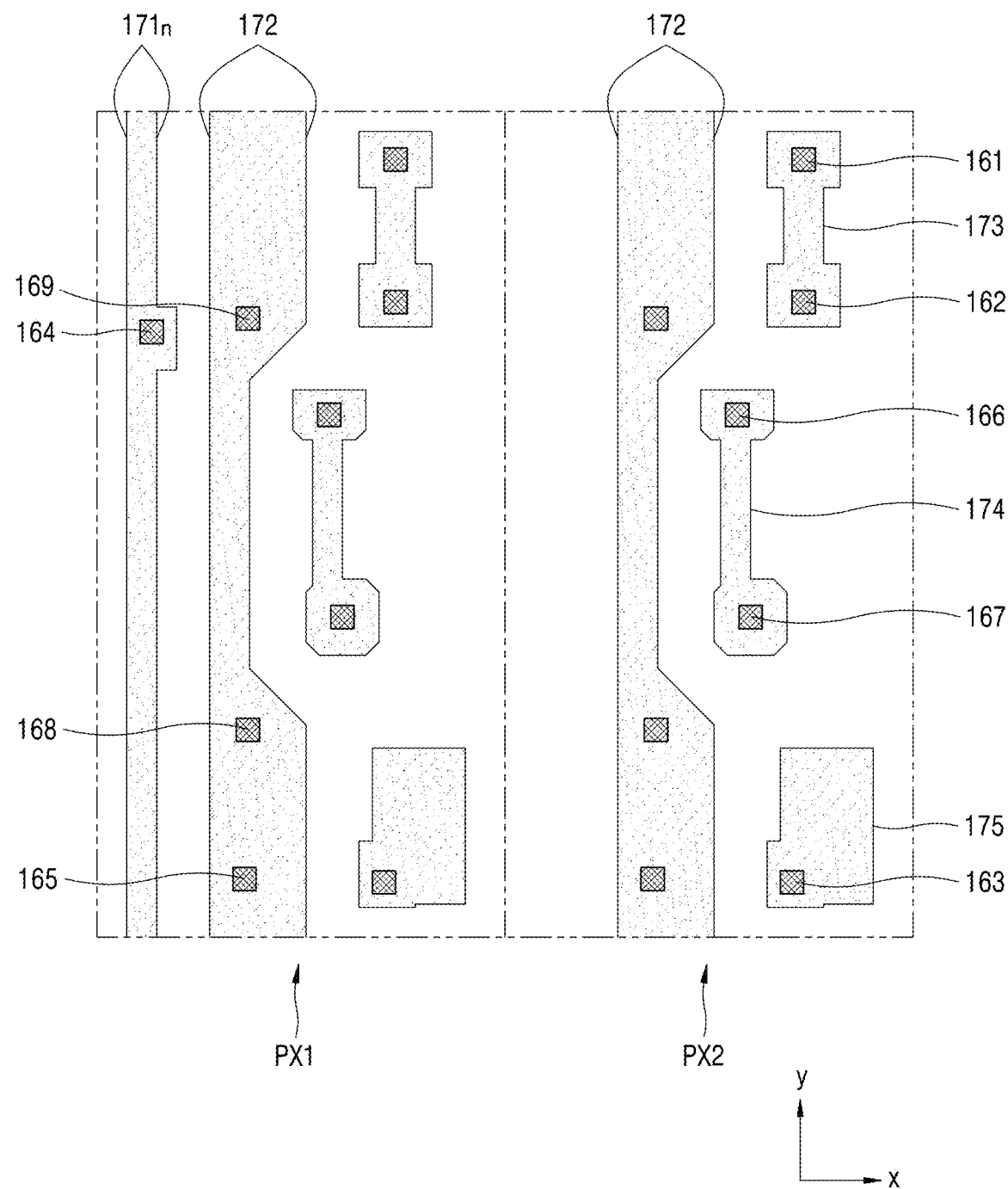
Figure 8:
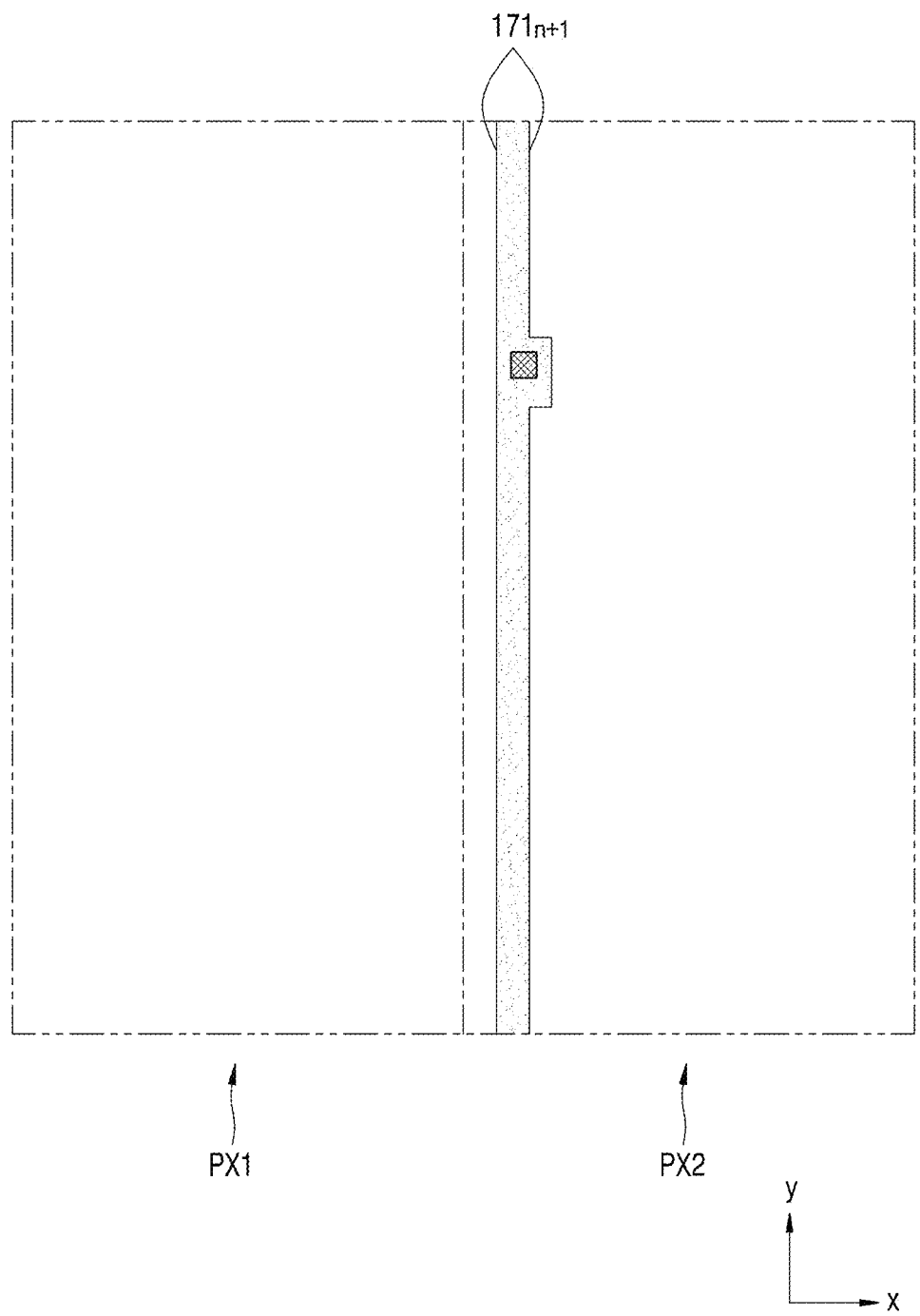

A drain electrode 175 connected to the semiconductor layer via contact holes defined in the first gate insulating layer 141 and the second gate insulating layer 142 may be positioned on the interlayer insulating layer 143. Here, the drain electrode 175 may be referred to as an intermediate connection layer. The drain electrode 175 as the intermediate connection layer may be connected to a drain region 177f via a contact hole 163. Of course, a variety of conductive layers including a source electrode in addition to the drain electrode 175 may be positioned on the interlayer insulating layer 143. In an exemplary embodiment, for example, as shown in FIG. 7, the power supply line 172, the initialization connection line 173, and the connection member 174 may be disposed on the interlayer insulating layer 143.

The power supply line 172 may be connected to the upper electrode 127 via a contact hole 168 defined in the interlayer insulating layer 143 and may be connected to a lower semiconductor layer via contact holes 165 and 169 defined in the first gate insulating layer 141, the second gate insulating layer 142, and the interlayer insulating layer 143 (See FIG. 3).

One end of the initialization connection line 173 may be connected to the initialization voltage line 124 via the contact hole 161 defined in the second gate insulating layer 142 and the interlayer insulating layer 143, and the other end of the initialization connection line 173 may be connected to an initialization source region 176d via the contact hole 162 defined in the first gate insulating layer 141, the second gate insulating layer 142, and the interlayer insulating layer 143 (See FIG. 3). An initialization drain region 177d is a portion of a semiconductor layer in which an impurity is doped in and a side portion opposite to the initialization source region 176d with respect to the initialization channel region 131d (See FIG. 4).

One end of the connection member 174 is connected to the compensation drain region 177c and the initialization drain region 177d via the contact hole 166 defined in the first gate insulating layer 141, the second gate insulating layer 142, and the interlayer insulating layer 143, and the other end of the connection member 174 is connected to the lower electrode 125a via the contact hole 167 defined in the second gate insulating layer 142 and the interlayer insulating layer 143. In this case, the other end of the connection member 174 is connected to the lower electrode 125a via the opening 27 defined in the upper electrode 127 (See FIG. 3).

The first pixel PX1 includes a first data line 171n positioned directly on the interlayer insulating layer 143. The first data line 171n may be connected to the switching source region 176b via the contact hole 164 defined in the first gate insulating layer 141, the second gate insulating layer 142, and the interlayer insulating layer 143. On the other hand, a second data line 171n+1 of the second pixel PX2 is not disposed directly on the interlayer insulating layer 143. (See FIG. 9).

A first insulating layer 151, a shielding layer 152, and a second insulating layer 153 are sequentially positioned on the drain electrode 175 and the first data line 171n, and the second data line 171n+1 of the second pixel PX2 is positioned on the second insulating layer 153, as illustrated in FIG. 9. That is, the first data line 171n of the first pixel PX1 and the second date line 171n+1 of the second pixel PX2 are at different heights. The second data line 171n+1 may be connected to the switching source region 176b of the second pixel PX2 via a contact hole 164 defined in the first gate insulating layer 141, the second gate insulating layer 142, the interlayer insulating layer 143, the first insulating layer 151, the shielding layer 152, and the second insulating layer 153. In this case, even not shown in FIG. 9, the second insulating layer 153 is provided to cover an inner side surface of the contact hole 164 and prevents sides of a metallic layer included in the shielding layer 152 from being exposed so that the second data line 171n+1 may be prevented from being electrically connected to the metallic layer included in the shielding layer 152.

In an exemplary embodiment, the first insulating layer 151 and the second insulating layer 153 may include silicon nitride, silicon oxide, or silicon oxynitride. The shielding layer 152 includes the metallic layer so that interference may be effectively prevented from occurring between the first data line 171n and the second data line 171n+1.

As described above, as the resolution of the display apparatus 10 increases, a distance between the first data line 171n and the second data line 171n+1 for applying data signals to the first and second pixels PX1 and PX2 decreases. Thus, the probability that electrical interference may occur between the first data line 171n and the second data line 171n+1 increases. In this case, if the first data line 171n and the second data line 171n+1 are positioned at opposite sides of the shielding layer 152, respectively (e.g., one data line is on the shielding layer 152 and the other data line is under the shielding layer 152), one of the first data line 171n and the second data line 171n+1 may be prevented from being interfered by a data signal applied to the other of the first data line 171n and the second data line 171n+1 due to the metallic layer included in the shielding layer 152. In addition, as the first data line 171n and the second data line 171n+1 are positioned on different layers, widths W1 and W2 of the first data line 171n and the second data line 171n+1 may increase. Thus, a resistance of the first data line 171n and the second data line 171n+1 may be reduced. Thus, because RC delay may be reduced while high resolution is realized, the display apparatus 10 may provide a high-quality image. In an alternative exemplary embodiment, the width W2 of the second data line 171n+1 may be greater than the width W1 of the first data line 171n since the number of components positioned in the same layer with the second data line 171n+1 positioned on the shielding layer 152 is less than the number of components positioned in the same layer with the first data line 171n.

FIG. 9 illustrates only two pixels PX1 and PX2 and the case that the first data line 171n of the first pixel PX1 and the second data line 171n+1 of the second pixel PX2 are at different heights. However, this should be understood that data lines included in two adjacent pixels among the plurality of pixels are at different heights. That is, a third data line included in a third pixel adjacent to the second pixel PX2 may be positioned directly on the interlayer insulating layer 143 like in the first data line 171n and thus may be positioned at a different height from the height of the second data line 171n+1. That is, data lines positioned at the same height may be alternately arranged in a first direction even though two data lines adjacent in the first direction have different heights.

Referring back to FIG. 9, a first organic insulating layer 154 is positioned at an upper portion of the emission control TFT T6. The first organic insulating layer 154 includes an organic material, and a top surface of the first organic insulating layer 154 may have approximately a flat shape regardless of the shape of top surfaces of structures positioned at a lower portion of the emission control TFT T6. Thus, the first organic insulating layer 154 may also be referred to as a planarization layer. In an exemplary embodiment, the first organic insulating layer 154 may include an organic material, such as acryl, benzocyclobutene ("BCB"), polyimide, or hexamethyldisiloxane ("HMDSO").

The pixel electrode 191 (e.g., pixel electrode 191a of the first pixel PX1 and pixel electrode 191b of the second pixel PX2) may be positioned on the first organic insulating layer 154 and may be connected to the drain electrode 175 under the first organic insulating layer 154. In detail, the pixel electrode 191 and the drain electrode 175 may be connected to each other via a contact hole defined in the first organic insulating layer 154, the first insulating layer 151, the shielding layer 152, and the second insulating layer 153. In this case, because the shielding layer 152 includes a metallic layer, in order to prevent a short between the metallic layer exposed to sides of the contact hole and the pixel electrode 191, the second insulating layer 153 is disposed to cover sides of the shielding layer 152 and the first insulating layer 151 at an inner-side surface of the contact hole. Thus, the pixel electrode 191 may be prevented from being electrically connected to another component such as the second data line 171n+1 via the metallic layer.

The pixel electrode 191 may be a (semi-)transparent electrode or a reflective electrode. In the case that the pixel electrode 191 is a (semi-)transparent electrode, the pixel electrode 191 may include ITO, IZO, ZnO, $In_2O_3$, IGO, or AZO, for example. In the case that the pixel electrode 191 is a reflective electrode, the pixel electrode 191 may have a reflective layer including Ag, Mg, Al, Pt, Pd, Au, Ni, Nd, Ir, Cr, and a compound thereof and a layer formed of ITO, IZO, ZnO, $In_2O_3$, IGO, or AZO, for example. Of course, the invention is not limited thereto. Various modifications are possible like that the pixel electrode 191 may include a variety of materials other than the materials mentioned above and may have a single layer or multi-layer structure.

A second organic insulating layer 192 that is a pixel-defining layer including an organic material may be positioned at an upper portion of the first organic insulating layer 154. The second organic insulating layer 192 defines an opening that corresponds to sub-pixels, i.e., an opening through which at least the center of the pixel electrode 191 is exposed, so that the second organic insulating layer 192 defines a pixel. Also, the second organic insulating layer 192 increases a vertical distance between edges of the pixel electrode 191 and the opposite electrode 195 at an upper portion of the pixel electrode 191 so that arcing may be prevented from occurring in the edges of the pixel electrode 191. In an exemplary embodiment, the second organic insulating layer 192 may include an organic material, for example, polyimide.

The intermediate layer 193 of the OLED 190 (e.g., intermediate layer 193a of the first pixel PX1 and intermediate layer 193b of the second pixel PX2) may include a small molecular weight material or polymer material. In the case that the intermediate layer 193 includes a small molecular weight material, the intermediate layer 193 may have a structure in which a hole injection layer ("HIL"), a hole transport layer ("HTL"), an emission layer ("EML"), an electron transport layer ("ETL") and an electron injection layer ("EIL") are stacked in a single layer or multi-layer structure. In the case that the intermediate layer 193 includes a polymer material, the intermediate layer 193 may include an HTL and an EML. Of course, the intermediate layer 193 according to the invention is not limited thereto. Of course, the intermediate layer 193 according to the invention is not limited thereto and may have various structures.

The opposite electrode 195 (e.g., opposite electrode 195a of the first pixel PX1 and opposite electrode 195b of the second pixel PX2) may be positioned at an upper portion of a display area so as to cover the display area. Here, the display area refers an area where image is displayed in a display device. That is, the opposite electrode 195 may be provided as one body common in the plurality of OLEDs 190 (e.g., OLEDs 190a of the first pixel PX1 and OLEDs 190b of the second pixel PX2) and may correspond to the plurality of pixel electrodes 191. The opposite electrode 195 may be a (semi-)transparent electrode or a reflective electrode. In the case that the opposite electrode 195 is a (semi-)transparent electrode, the opposite electrode 195 may have a layer including metal having a small work function, i.e., Li, Ca, LiF/Ca, LiF/Al, Al, Ag, Mg, and a compound thereof and a (semi-)transparent conductive layer such as ITO, IZO, ZnO or $In_2O_3$, for example. In the case that the opposite electrode 195 is a reflective electrode, the opposite electrode 195 may have a layer including Li, Ca, LiF/Ca, LiF/Al, Al, Ag, Mg, and a compound thereof, for example. Of course, the configuration and material of the opposite electrode 195 according to the invention are not limited thereto, and various modifications are possible.

Figure 10:
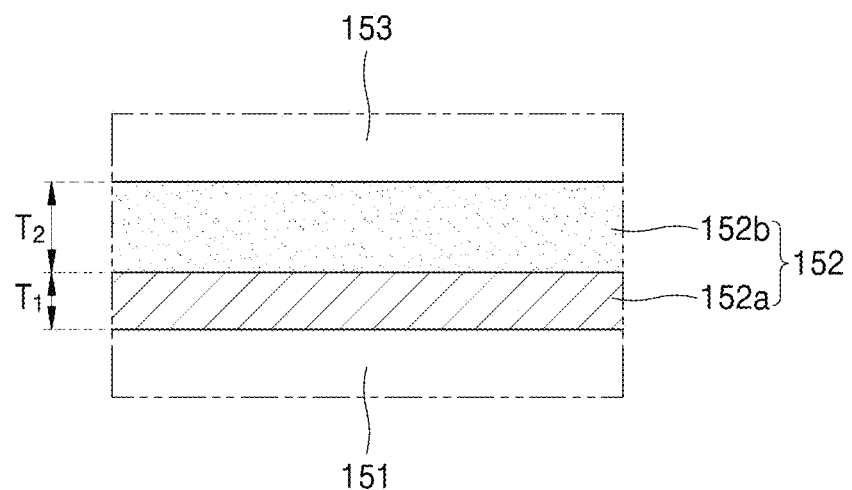
FIG. 10 is a cross-sectional view schematically illustrating an example of a shielding layer of FIG. 9.
Figure 11:
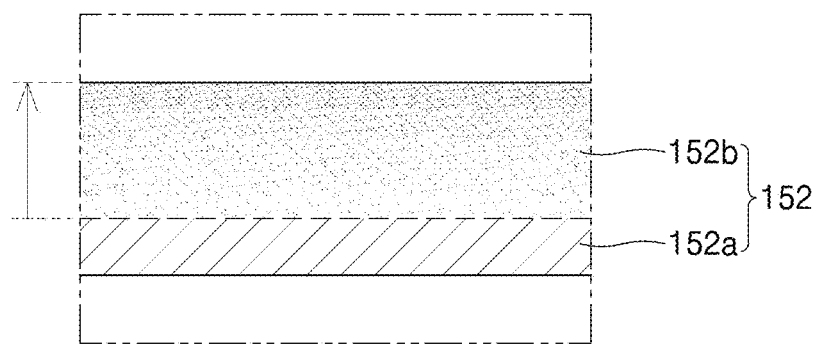
FIG. 11 is a cross-sectional view schematically illustrating another example of the shielding layer of FIG. 9.
Figure 12:
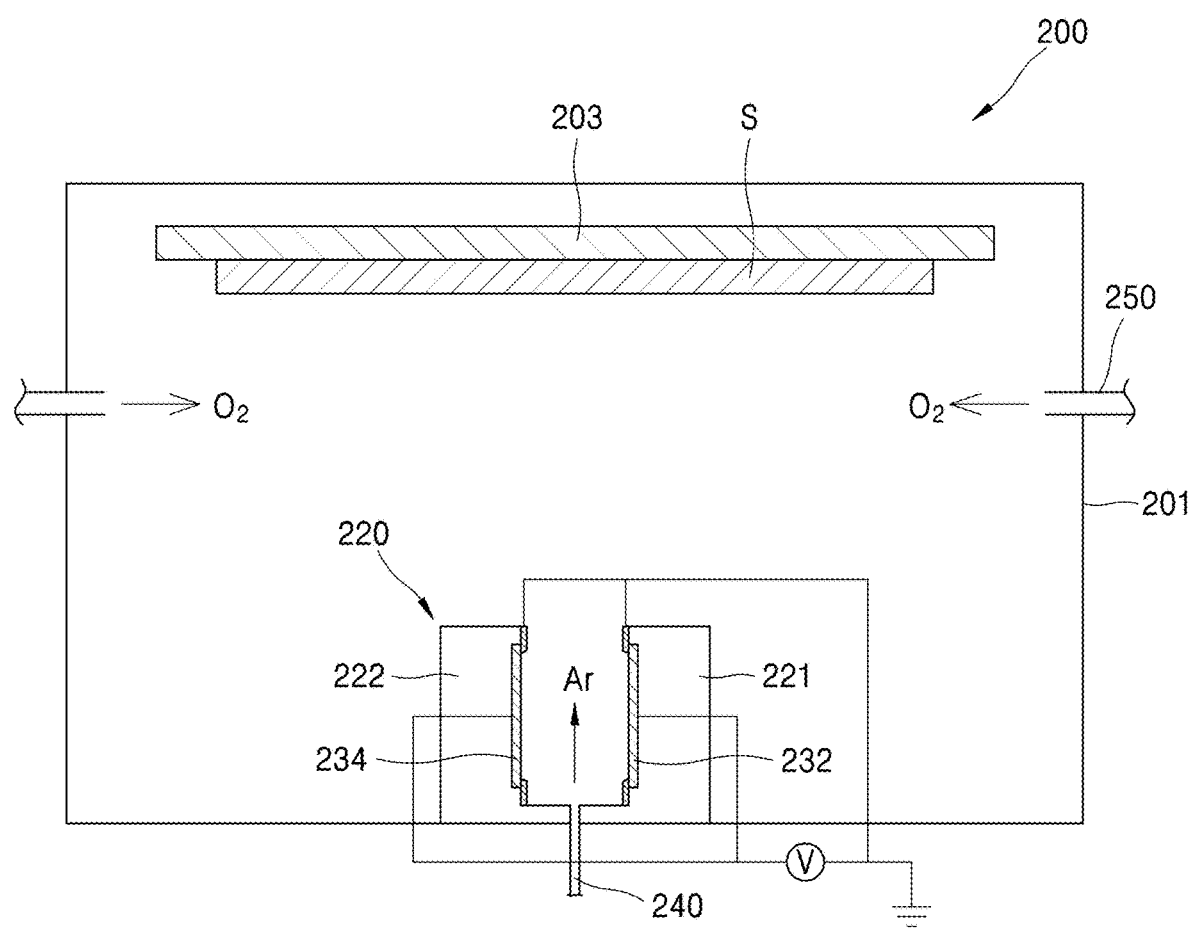
FIG. 12 is a cross-sectional view schematically illustrating a method of manufacturing the display apparatus of FIG. 1.

FIGS. 10 and 11 illustrate examples of the shielding layer of FIG. 9, and FIG. 12 is a cross-sectional view schematically illustrating a method of manufacturing the display apparatus 10 of FIG. 1, which illustrates a method of forming a shielding layer schematically.

First, referring to FIG. 10, the shielding layer 152 may have a stack structure of the metallic layer 152a and the metallic oxide layer 152b. In this case, the metallic oxide layer 152b is positioned on the metallic layer 152a. That is, according to exemplary embodiments, a stack order of the first insulating layer 151, the metallic layer 152a, the metallic oxide layer 152b, and the second insulating layer 153 is provided.

The metallic layer 152a may prevent crosstalking between two data lines arranged at an upper side and a lower side of the shielding layer 152 respectively, as described above. The metallic layer 152a may be in a floating state.

The type of the metallic layer 152a according to the invention is not limited if the metallic layer 152a blocks electromagnetic waves. In an exemplary embodiment, the metallic layer 152a may include iron (Fe), Cr, Mn, Ni, Ti, Mo, Al, or P. However, in order to prevent crosstalking between the data lines, a thickness T1 of the metallic layer 152a may be 500 Å or more.

The metallic layer 152a may be provided as one body so as to correspond to the plurality of pixels. Thus, in order to prevent components arranged on the metallic layer 152a, such as a pixel electrode, from being shorted due to the metallic layer 152a, the second insulating layer 153 is provided on the metallic layer 152a. The second insulating layer 153 may be formed by chemical vapor deposition ("CVD"). When the second insulating layer 153 is formed by CVD, arcing may occur due to the metallic layer 152a exposed in a deposition process. Thus, damage such as cracks may occur in the second insulating layer 153. In order to prevent this problem, a metallic oxide layer 152b may be further disposed on the metallic layer 152a. The metallic oxide layer 152b may prevent the metallic layer 152a from being exposed after a process of forming the metallic layer 152a so that a problem of arcing described above may be prevented.

The metallic oxide layer 152b may include an oxide of a metallic material included in the metallic layer 152a. Also, the metallic oxide layer 152b may be formed continuously with the metallic layer 152a when the metallic layer 152a is formed.

In another example, FIG. 12 illustrates a method of forming the metallic layer 152a using sputtering schematically. First, a sputter device 200 of FIG. 12 may include a chamber 201, a stage 203, which is positioned in the chamber 201 and on which a substrate S is seated, and a sputter portion 220 for forming a thin layer on the substrate S.

The inside of the chamber 201 may be maintained in a vacuum state, and the shielding layer 152 may be formed on the substrate S seated on the stage 203 by sputtering of the sputter portion 220.

In an example, the sputter portion 220 may include a first target portion 221 and a second target portion 222 which face each other. A pair of targets 232 and 234 are mounted on the first target portion 221 and the second target portion 222 to face each other, and the pair of targets 232 and 234, the first target portion 221 and the second target portion 222 are electrically connected to a power supply unit (not shown), such as a direct current ("DC") power supply, via a power supply line. An inert gas, such as an argon (Ar) gas may be supplied between the first target portion 221 and the second target portion 222 via a pipe 240.

When power is supplied between the pair of targets 232 and 234 and between the first target portion 221 and the second target portion 222, discharge occurs in a space between the pair of targets 232 and 234, and electrons generated by discharge collide with the Ar gas so that the Ar gas is ionized and thus plasma may be generated. An Ar ion collides with the pair of targets 232 and 234 including a metallic layer 152a. Thus, atoms or molecules of a material for forming the metallic layer 152a are ejected from the pair of targets 232 and 234 and are deposited on the substrate S so that the metallic layer 152a may be formed.

When the metallic layer 152a is formed to a predetermined thickness or more, oxygen ($O_2$) is injected into the chamber 201 via a pipe 250 so that a metallic oxide layer 152b may be formed on the metallic layer 152a, as illustrated in FIG. 10.

The metallic oxide layer 152b may have a thickness T2 of 1000 Å or more. Thus, when a second insulating layer 153 is formed on the shielding layer 152, arcing may be effectively prevented from occurring due to the metallic oxide layer 152b.

When the metallic oxide layer 152b is formed by injecting oxygen ($O_2$) into the chamber 201, as described above, the content of injected oxygen ($O_2$) is gradually increased so that the concentration of oxygen in the metallic oxide layer 152b may be gradually increased from a lower portion to an upper portion of the metallic oxide layer 152b, as illustrated in FIG. 11.

The metallic oxide layer 152b that is a layer formed by injecting oxygen ($O_2$) while the metallic layer 152a is formed, an unoxidized metallic material may be included in the metallic oxide layer 152b, and this may function as a path on which a current may flow. Thus, when the metallic oxide layer 152b is formed, the concentration of injected oxygen ($O_2$) is gradually increased so that an unoxidized metallic material may not be included in the upper portion of the metallic oxide layer 152b. Thus, arcing may be more effectively prevented from occurring due to the metallic layer 152a in a subsequent process.

As described above, in a display apparatus according to one or more exemplary embodiments, as two adjacent wirings among wirings for applying electrical signals to pixels are at different heights and a shielding layer is positioned therebetween, an interference phenomenon may be prevented from occurring between the wirings. Also, because widths of the wirings may be increased, resistance of the wirings is reduced and accordingly, high resolution may be realized and a high-quality image may be provided due to a reduction in RC delay. Of course, the invention is not limited by these effects.

It should be understood that exemplary embodiments described herein should be considered in a descriptive sense only and not for purposes of limitation. Descriptions of features or aspects within each exemplary embodiment should be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a first pixel positioned on the substrate;
a first data line which applies a first data signal to the first pixel;
a second pixel positioned on the substrate and being adjacent to the first pixel;
a second data line which applies a second data signal to the second pixel; and
a shielding layer between the first data line and the second data line, the shielding layer including a metallic layer,
wherein the first data line and the second data line are parallel to each other and one of the first data line and the second data line is disposed above the shielding layer and the other of the first data line and the second data line is disposed below the shielding layer.

2. The display apparatus of claim 1, wherein the shielding layer further comprises a metallic oxide layer on the metallic layer.

3. The display apparatus of claim 2, wherein a metallic oxide in the metallic oxide layer is an oxide of metal in the metallic layer.

4. The display apparatus of claim 2, wherein a concentration of oxygen in the metallic oxide layer is gradually increased from a lower portion to an upper portion of the metallic oxide layer.

5. The display apparatus of claim 1, further comprising, between the first data line and the second date line, a first insulating layer and a second insulating layer, which are positioned at a lower portion and an upper portion of the shielding layer, respectively.

6. The display apparatus of claim 5, wherein each of the first pixel and the second pixel comprises an organic light-emitting diode (OLED) and a pixel electrode and a circuit unit for driving the OLED, and
the circuit unit comprises a thin-film transistor (TFT) including a drain electrode electrically connected to the pixel electrode,
the first data line is on a same layer as the drain electrode, and
an organic insulating layer is positioned between the second data line and the pixel electrode.

7. The display apparatus of claim 6, wherein the pixel electrode is electrically connected to the drain electrode via a contact hole in the organic insulating layer, the second insulating layer, the shielding layer, and the first insulating layer, and the second insulating layer covers side surfaces of the shielding layer and the first insulating layer at an inner side surface of the contact hole.

8. The display apparatus of claim 1, wherein the shielding layer is positioned as one body commonly to correspond to the first pixel and the second pixel.

9. The display apparatus of claim 1, wherein the shielding layer is in a floating state.

10. The display apparatus of claim 1, wherein a width of the second data line positioned on the shielding layer is greater than a width of the first data line positioned under the shielding layer.

11. A display apparatus comprising:
a pixel unit comprising a plurality of pixels and a plurality of data lines which applies a data signal to the plurality of pixels and is arranged to be parallel to each other;
a data driving unit which generates the data signal and is connected to the plurality of data lines; and
a shielding layer which blocks signal interference between two adjacent data lines among the plurality of data lines, is positioned between the two adjacent data lines, and is positioned as one body commonly to correspond to the plurality of pixels,
wherein one of the two adjacent data lines is disposed above the shielding layer and the other of the two data lines is disposed below the shielding layer.

12. The display apparatus of claim 11, wherein the shielding layer comprises a metallic layer and a metallic oxide layer on the metallic layer.

13. The display apparatus of claim 12, wherein a metallic oxide in the metallic oxide layer is an oxide of metal in the metallic layer.

14. The display apparatus of claim 12, wherein a concentration of oxygen in the metallic oxide layer is gradually increased from a lower portion to an upper portion of the metallic oxide layer.

15. The display apparatus of claim 11, wherein the shielding layer is in a floating state.

16. The display apparatus of claim 11, wherein first data lines among the plurality of data lines positioned at the lower portion of the shielding layer, and second data lines among the plurality of data lines positioned at the upper portion of the shielding layer, are alternately arranged in a first direction.

17. The display apparatus of claim 16, further comprising, between the first data lines and the second data lines, a first insulating layer and a second insulating layer, which are positioned at the lower portion and the upper portion of the shielding layer, respectively.

18. The display apparatus of claim 17, wherein each of the plurality of pixels comprises an organic light-emitting diode (OLED) and a pixel electrode and a circuit unit for driving the OLED, and
the circuit unit comprises a thin-film transistor (TFT) including a drain electrode electrically connected to the pixel electrode, and
the first data lines are positioned on a same layer as the drain electrode, and
an organic insulating layer is positioned on the second data lines, and
the pixel electrode is positioned on the organic insulating layer.

19. The display apparatus of claim 18, wherein the pixel electrode is electrically connected to the drain electrode via a contact hole in the organic insulating layer, the second insulating layer, the shielding layer, and the first insulating layer, and the second insulating layer covers side surfaces of the shielding layer and the first insulating layer at an inner side surface of the contact hole.

20. The display apparatus of claim 16, wherein widths of the second data lines are greater than widths of the first data lines.

* * * * *